(12) United States Patent
Liu et al.

(10) Patent No.: US 9,660,209 B2
(45) Date of Patent: *May 23, 2017

(54) METHOD FOR MANUFACTURING OLED DEVICE AND OLED DEVICE MANUFACTURED THEREWITH

(71) Applicant: Shenzhen China Star Optoelectronics Technology Co., Ltd., Shenzhen, Guangdong (CN)

(72) Inventors: Yawei Liu, Guangdong (CN); Yifan Wang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 98 days.

This patent is subject to a terminal disclaimer.

(21) Appl. No.: 14/424,001

(22) PCT Filed: Oct. 31, 2014

(86) PCT No.: PCT/CN2014/089955
§ 371 (c)(1),
(2) Date: Feb. 25, 2015

(87) PCT Pub. No.: WO2016/058223
PCT Pub. Date: Apr. 21, 2016

(65) Prior Publication Data
US 2016/0254473 A1    Sep. 1, 2016

(30) Foreign Application Priority Data

Oct. 13, 2014 (CN) .......................... 2014 1 0537662

(51) Int. Cl.
*H01L 51/00* (2006.01)
*H01L 51/50* (2006.01)
(Continued)

(52) U.S. Cl.
CPC ............ *H01L 51/502* (2013.01); *B82Y 20/00* (2013.01); *H01L 27/3211* (2013.01);
(Continued)

(58) Field of Classification Search
CPC . H01L 27/322; H01L 51/502; H01L 51/5056; H01L 51/5072; H01L 51/56;
(Continued)

(56) References Cited

U.S. PATENT DOCUMENTS 9,276,046 B2 * 3/2016 Liu ........................ H01L 51/502
9,379,344 B2 * 6/2016 Yang ..................... H01L 51/502
(Continued)

FOREIGN PATENT DOCUMENTS

| CN | 101707237 A | 5/2010 |
|---|---|---|
| CN | 101764090 A | 6/2010 |
| CN | 104051672 A | 9/2014 |

*Primary Examiner* — Bac Au
(74) *Attorney, Agent, or Firm* — Andrew C. Cheng

(57) ABSTRACT

The present invention provides a method for manufacturing an OLED device and an OLED device manufactured therewith. The method for manufacturing an OLED device includes: (1) providing a substrate and forming, in sequence, an anode and a hole transporting layer on the substrate; (2) forming an emissive layer on the hole transporting layer through a solution film casting process, wherein the emissive layer comprises a red sub-pixel, a green sub-pixel, and a blue sub-pixel, of which at least one sub-pixel is formed of a quantum dot and at least one sub-pixel is formed of an organic light-emitting material; (3) forming, in sequence, an electron transporting layer and a cathode on the emissive layer; and (4) providing a package cover plate, which is set above the cathode, wherein the substrate and the package cover plate are bonded together by sealing enclosing resin to complete packaging of the OLED device. Since each sub-pixel of the emissive layer is formed through a solution film casting process, the manufacture of the OLED device
(Continued)

requires no use of a fine metal mask so that the manufacturing cost is low, the utilization rate of material is high, and the yield rate is good.

10 Claims, 5 Drawing Sheets

(51) Int. Cl.
    *H01L 51/56*     (2006.01)
    *B82Y 20/00*     (2011.01)
    *H01L 27/32*     (2006.01)
    *H01L 51/52*     (2006.01)
    *B82Y 40/00*     (2011.01)

(52) U.S. Cl.
    CPC ........ *H01L 27/3244* (2013.01); *H01L 51/001* (2013.01); *H01L 51/0003* (2013.01); *H01L 51/5056* (2013.01); *H01L 51/5072* (2013.01); *H01L 51/5206* (2013.01); *H01L 51/5221* (2013.01); *H01L 51/5253* (2013.01); *H01L 51/56* (2013.01); *B82Y 40/00* (2013.01); *H01L 51/0035* (2013.01); *H01L 51/0037* (2013.01); *H01L 51/0058* (2013.01); *H01L 51/0061* (2013.01); *H01L 51/0065* (2013.01); *H01L 51/0067* (2013.01); *H01L 51/0072* (2013.01); *H01L 51/0081* (2013.01); *H01L 51/0085* (2013.01); *H01L 51/5012* (2013.01); *H01L 2227/323* (2013.01); *Y10S 977/774* (2013.01); *Y10S 977/824* (2013.01); *Y10S 977/89* (2013.01); *Y10S 977/952* (2013.01)

(58) Field of Classification Search
    CPC ............. H01L 51/5088; H01L 27/3211; H01L 2227/323; H01L 27/3213; H01L 27/3244; H01L 51/0035; H01L 51/0061; H01L 51/0081; H01L 51/5246; H01L 27/1214; H01L 27/32; H01L 27/3206; H01L 27/3218; H01L 33/005; H01L 51/001; H01L 51/0059; H01L 51/50
    See application file for complete search history.

(56) References Cited

U.S. PATENT DOCUMENTS

| | | | | |
|---|---|---|---|---|
| 9,492,681 | B2* | 11/2016 | Aydt | ................... A61F 9/00834 |
| 2009/0039764 | A1* | 2/2009 | Cho | ...................... B82Y 10/00 313/504 |
| 2012/0128894 | A1* | 5/2012 | Zhigang | ................. C23C 14/30 427/566 |
| 2012/0154464 | A1* | 6/2012 | Ninan | ................ G02B 27/2264 345/691 |
| 2014/0204128 | A1* | 7/2014 | Jiang | ................. G02F 1/133617 345/690 |
| 2014/0374697 | A1* | 12/2014 | Liu | ....................... H01L 51/502 257/13 |
| 2015/0185381 | A1* | 7/2015 | Wu | ....................... G02B 5/201 349/106 |
| 2015/0228580 | A1* | 8/2015 | Chen | ..................... H01L 24/27 257/531 |
| 2015/0318506 | A1* | 11/2015 | Zhou | ....................... G02B 5/20 257/40 |
| 2015/0357392 | A1* | 12/2015 | You | .................... H01L 27/3223 257/40 |
| 2016/0218141 | A1* | 7/2016 | Cai | ........................ H01L 27/322 |
| 2016/0248029 | A1* | 8/2016 | Liu | ........................ H01L 51/001 |
| 2016/0260921 | A1* | 9/2016 | Liu | ......................... H01L 51/56 |
| 2016/0285015 | A1* | 9/2016 | Li | ......................... C07F 15/0086 |
| 2016/0301024 | A1* | 10/2016 | He | ....................... H01L 51/5096 |

* cited by examiner

METHOD FOR MANUFACTURING OLED DEVICE AND OLED DEVICE MANUFACTURED THEREWITH

BACKGROUND OF THE INVENTION

1. Field of the Invention

The present invention relates to the field of displaying technology, and in particular to a method for manufacturing an OLED device and an OLED device manufactured therewith.

2. The Related Arts

An OLED (Organic Light-Emitting Diode) is a flat panel displaying technique of extremely prosperous future and it shows excellent displaying performance and also possesses various advantages, such as being self-luminous, simple structure, being ultra-thin, fast response, wide view angle, low power consumption, and being capable of achieving flexible displaying and is thus regarded as a "dream display". In addition, the investment of manufacturing installation is far less than that of liquid crystal displays so that it has attracted the attention of major display manufacturers and becomes the mainstream of the third-generation display devices of the field of displaying technology.

Semiconductor nanocrystals (NCs) are semiconductor nanocrystals having a size of 1-100 nm. Since the semiconductor nanocrystals has a size smaller than exciton Bohn radii of other materials, show a strong quantum confinement effect, and exhibit new material properties, they are also referred to as quantum dots (QDs).

Being excited by external energies (such as photoluminescence, electroluminescence, and cathodoluminescence), an electron leaps from the ground state to an excited state. Electrons and holes, when staying in the excited state, may form excitons. The electrons and the holes recombine and eventually relax back to the ground state. Excessive energy may be released through the process of recombination and relaxation and there could be radiative recombination that gives off photons.

Quantum dots light-emitting diodes (QD-LEDs) have very important value for commercial applications and have attracted strong intentions for research and development for the recent decade. In fact, compared to organic light-emitting diodes (OLEDs), QD-LEDs have various advantages. (1) The light emitting from quantum dot has a line width between 20-30 nm and compared to that of the light emitting from OELDs that is greater than 50 nm, FWHM (Full Width as Half Maximum) is relatively narrow, providing a key factor for achieving color purity of an image. (2) Inorganic materials have better thermal stability than organic materials. When a device is in a condition of high brightness or high current density, Joule heat is a major cause for deterioration of the device. Due to the excellent thermal stability, an inorganic material based device would show an extended lifespan. (3) The organic materials used for the three primary colors of red, green, and blue are of different lifespan and the color displayed by OLEDs would vary with time. However, QDs can be formed of the same material to show different sizes and emission of light with different colors can be achieved through the quantum confinement effect. The same material exhibits the same deterioration rate. (4) QD-LEDs can achieve emission of infrared light, while the wavelength of the emitting light of organic material is generally less than 1 micrometer. (5) Quantum dots are not subjected to constraint imposed by spin statistics and the external quantum efficiency (EQE) may possibly reach 100%.

On the other hand, the evaporation process of OLED devices requires the use of a fine metal mask (FFM). The process is expensive and has a low utilization rate of material and poor yield rate. Thus, it is desired to have a novel OLED device that has a simple manufacturing process, a high utilization rate of material, and a good yield rate.

SUMMARY OF THE INVENTION

An object of the present invention is to provide a method for manufacturing an OLED device and an OLED device manufactured therewith, which has an emissive layer of which each type of sub-pixel is made through solution film casting, wherein at least one type of sub-pixel is made of an organic light-emitting material, where the manufacturing process of the OLED device requires no use of a fine metal mask so that the manufacturing cost is low, the utilization rate of material is high, and the yield rate is good.

To achieve the above object, the present invention provides a method for manufacturing an organic light-emitting diode (OLED) device, which comprises:

(1) providing a substrate and forming, in sequence, an anode and a hole transporting layer on the substrate;

(2) forming an emissive layer on the hole transporting layer through a solution film casting process, wherein the emissive layer comprises a red sub-pixel, a green sub-pixel, and a blue sub-pixel, of which at least one sub-pixel is formed of a quantum dot and at least one sub-pixel is formed of an organic light-emitting material;

(3) forming, in sequence, an electron transporting layer and a cathode on the emissive layer; and (4) providing a package cover plate, which is set above the cathode, wherein the substrate and the package cover plate are bonded together by sealing enclosing resin to complete packaging of the OLED device.

The anode, the hole transporting layer, the electron transporting layer, and the cathode are each formed through a vacuum thermal evaporation process. The electron transporting layer is formed of tris-(8-hydroxyquinolinato)aluminum and the hole transporting layer is formed of poly (triphenylamine) or poly(ethylenedioxythiophene).

The substrate comprises a thin-film transistor (TFT) substrate. The substrate and the package cover plate are formed of glass or a flexible material. At least one of the substrate and the package cover plate is light transmittable.

In step (2), at least one of the sub-pixels is formed of a quantum dot and if the red sub-pixel is formed of a quantum dot, then the red sub-pixel is made by mixing an organic host material with a red quantum dot and a solvent, coating and volatizing to remove the solvent; if the green sub-pixel is formed of a quantum dot, then the green sub-pixel is made by mixing an organic host material with a green quantum dot and a solvent, coating and volatizing to remove the solvent; and if the blue sub-pixel is formed of a quantum dot, then the blue sub-pixel is made by mixing an organic host material with a blue quantum dot and a solvent, coating and volatizing to remove the solvent; the blue quantum dot comprises ZnCdS, CdSe/ZnS or nanometer $SiN_4$, the green quantum dot comprising CdSe/ZnS or ZnSe:$Cu^{2+}$, the red quantum dot comprising CdSe/CdS/ZnS; the organic host material comprises 4,4',4''-tri(carbazol-9-yl)-triphenylamine or 2,4,6-tri(9H-carbazol-9-yl)-1,3,5-triazine; and the solvent comprises methanol, ethanol, chlorobenzene, or chloroform.

In step (2), at least one of the sub-pixels is formed of a quantum dot and if the red sub-pixel is formed of a quantum dot, then the red sub-pixel is made by mixing a red quantum dot with a surface coating agent and a solvent, coating and volatizing to remove the solvent; if the green sub-pixel is formed of a quantum dot, then the green sub-pixel is made by mixing a green quantum dot with a surface coating agent and a solvent, coating and volatizing to remove the solvent; and if the blue sub-pixel is formed of a quantum dot, then the blue sub-pixel is made by mixing a blue quantum dot with a surface coating agent and a solvent, coating and volatizing to remove the solvent; the surface coating agent comprises stearic acid, trioctylphosphine oxide, or poly(methyl methacrylate); the solvent comprises methanol, ethanol, water, chlorobenzene, or chloroform; and the blue quantum dot comprises ZnCdS, CdSe/ZnS or nanometer $SiN_4$, the green quantum dot comprising CdSe/ZnS or ZnSe:$Cu^{2+}$, the red quantum dot comprising CdSe/CdS/ZnS.

In step (2), the at least one of the sub-pixels being formed of a quantum dot is that the blue sub-pixel is formed of a quantum dot.

In step (2), at least one of the sub-pixels is formed of an organic light-emitting material and if the red sub-pixel is formed of an organic light-emitting material, then the red sub-pixel is made by mixing an organic host material with a red light emissive material and a solvent, coating and volatizing to remove the solvent; if the green sub-pixel is formed of an organic light-emitting material, then the green sub-pixel is made by mixing an organic host material with a green light emissive material and a solvent, coating and volatizing to remove the solvent; and if the blue sub-pixel is formed of an organic light-emitting material, then the blue sub-pixel is made by mixing an organic host material with a blue light emissive material and a solvent, coating and volatizing to remove the solvent; the blue light emissive layer comprises 9,10-di(beta-naphthyl)anthracene, the green light emissive layer comprising tris(2-phenylpyridine) iridium, the red light emissive layer comprising 4-(dicyanomethylene)-2-methyl-6-(4-di methylaminostyryl)-4H-pyran; the organic host material comprises 4,4',4"-tri(carbazol-9-yl)-triphenylamine or 2,4,6-tri(9H-carbazol-9-yl)-1,3,5-triazine; and the solvent comprises methanol, ethanol, chlorobenzene, or chloroform.

In step (2), the at least one of the sub-pixels being formed of an organic light-emitting material is that the red sub-pixel and the green sub-pixel are formed of organic light-emitting materials.

The present invention also provides an OLED device, which comprises a substrate, an anode formed on the substrate, a hole transporting layer formed on the anode, an emissive layer formed on the hole transporting layer, an electron transporting layer formed on the emissive layer, a cathode formed on the electron transporting layer, a package cover plate arranged above the cathode, and sealing enclosing resin arranged between the substrate and the package cover plate to bond the substrate and the package cover plate together. The emissive layer comprises a red sub-pixel, a green sub-pixel, and a blue sub-pixel. Each of the sub-pixels is formed through a solution film casting process. At least one of the sub-pixels is made of a quantum dot and at least one of the sub-pixels is made of an organic light-emitting material.

The blue sub-pixel is formed of a quantum dot and the red sub-pixel and the green sub-pixel are formed of organic light-emitting materials.

The efficacy of the present invention is that the present invention provides a method for manufacturing an OLED device, wherein each of sub-pixels of an emissive layer is formed through a solution film casting process and an anode, a hole transporting layer, an electron transporting layer, and a cathode are formed through vacuum thermal evaporation processes, so that the method for manufacturing the OLED device requires no use of a fine metal mask thereby making the manufacturing cost incurring with the manufacturing method low, the utilization rate of material high, and the yield rate good; and with at least one sub-pixel of the emissive layer being formed of a quantum dot and at least one sub-pixel being formed of an organic light-emitting material, the manufacturing method according to the present invention, when compared with a manufacturing method where all sub-pixels are formed of quantum dots, has a relatively low manufacturing cost and, when compared with a manufacturing method where all sub-pixels are formed of organic light-emitting materials, provides an OLED device having a better performance. An OLED device manufactured with the present invention combines the advantages of a QD-OLED and a solution-film-cast OLED so as to possesses excellent performance, allowing for application to flat panel displays, televisions, and other fields of displaying.

BRIEF DESCRIPTION OF THE DRAWINGS

The technical solution, as well as other beneficial advantages, of the present invention will become apparent from the following detailed description of an embodiment of the present invention, with reference to the attached drawings.

In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
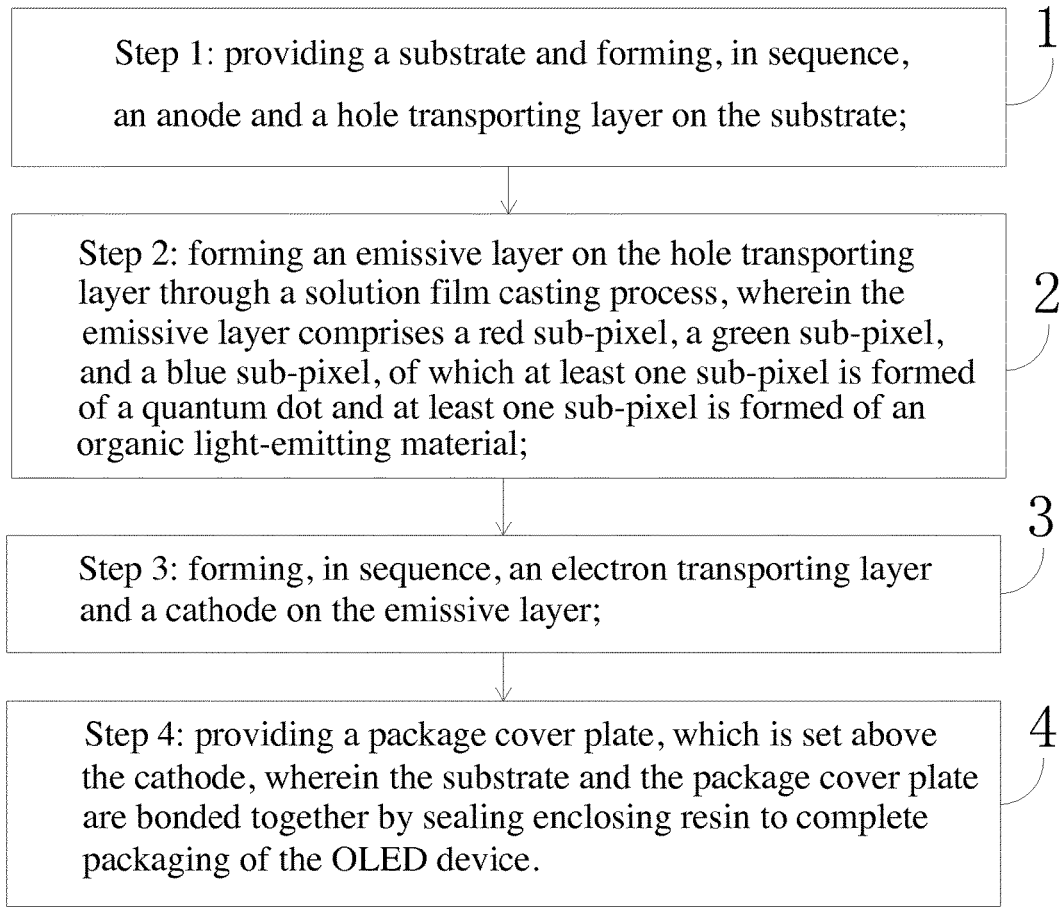
FIG. 1 is a flow chart illustrating a method for manufacturing an OLED (Organic Light-Emitting Diode) device according to the present invention.

Referring to FIG. 1, the present invention provides a method for manufacturing an organic light-emitting diode (OLED) device, which comprises:

Step 1: providing a and forming, in sequence, an anode 21 and a hole transporting layer 22 on the substrate 1.

Step 2: forming an emissive layer 23 on the hole transporting layer 22 through a solution film casting process, wherein the emissive layer 23 comprises a red sub-pixel 231, a green sub-pixel 232, and a blue sub-pixel 233, of which at least one sub-pixel is formed of a quantum dot and at least one sub-pixel is formed of an organic light-emitting material.

Step 3: forming, in sequence, an electron transporting layer 24 and a cathode 25 on the emissive layer 23.

Step 4: providing a package cover plate 2, which is set above the cathode 25, wherein the substrate 1 and the package cover plate 2 are bonded together by sealing enclosing resin 3 to complete packaging of the OLED device.

In Step 2, at least one of the sub-pixels is formed of a quantum dot. If the red sub-pixel 231 is formed of a quantum dot, then the red sub-pixel 231 can be made by mixing an organic host material with a red quantum dot and a solvent, coating and volatizing to remove the solvent; if the green sub-pixel 232 is formed of a quantum dot, then the green sub-pixel 232 can be made by mixing an organic host material with a green quantum dot and a solvent, coating and volatizing to remove the solvent; and if the blue sub-pixel 233 is formed of a quantum dot, then the blue sub-pixel 233 can be made by mixing an organic host material with a blue quantum dot and a solvent, coating and volatizing to remove the solvent.

The organic host material comprises TCTA (4,4',4''-tri(carbazol-9-yl)-triphenylamine) or TRZ (2,4,6-tri(9H-carbazol-9-yl)-1,3,5-triazine).

The compound TCTA (4,4',4''-tri(carbazol-9-yl)-triphenylamine) has a structural formula as follows:

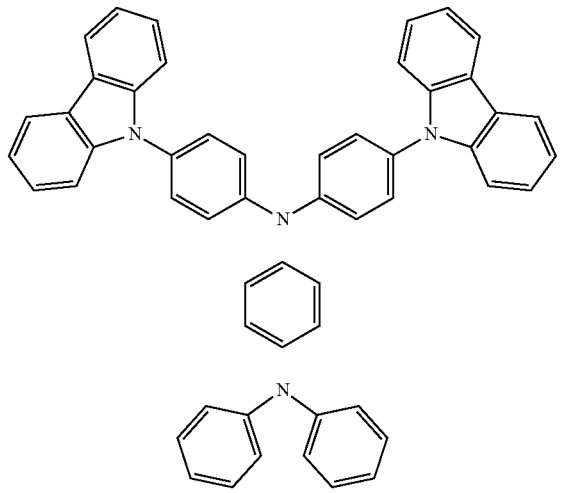

The compound TRZ (2,4,6-tri(9H-carbazol-9-yl)-1,3,5-triazine) has a structural formula as follows:

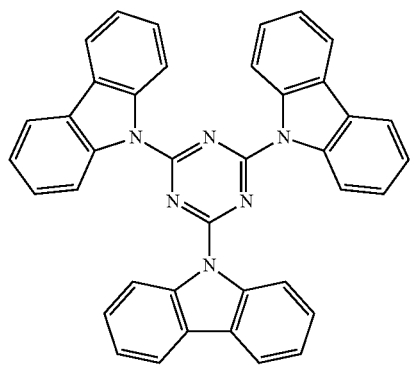

The solvent may comprise methanol, ethanol, chlorobenzene, or chloroform.

In Step 2, at least one of the sub-pixels is formed of a quantum dot. If the red sub-pixel 231 is formed of a quantum dot, then the red sub-pixel 231 can be made by mixing a red quantum dot with a surface coating agent and a solvent, coating and volatizing to remove the solvent; if the green sub-pixel 232 is formed of a quantum dot, then the green sub-pixel 232 can be made by mixing a green quantum dot with a surface coating agent and a solvent, coating and volatizing to remove the solvent; and if the blue sub-pixel 233 is formed of a quantum dot, then the blue sub-pixel 233 can be made by mixing a blue quantum dot with a surface coating agent and a solvent, coating and volatizing to remove the solvent.

The blue quantum dot may comprises ZnCdS, CdSe/ZnS or nanometer $SiN_4$. The green quantum dot may comprise CdSe/ZnS or ZnSe:$Cu^{2+}$. The red quantum dot may comprise CdSe/CdS/ZnS.

The surface coating agent may comprise a stearic acid, trioctylphosphine oxide, or poly(methyl methacrylate).

The solvent may comprise methanol, ethanol, water, chlorobenzene, or chloroform.

Preferably, in Step 2, the at least one of the sub-pixels being formed of a quantum dot is that the blue sub-pixel 233 is formed of a quantum dot.

In the above-described method of using a quantum dot to form a sub-pixel, the organic host material and the surface coating agent provide a common effect that is to prevent aggregation and oxidization of the quantum dot. Since a quantum dot is a nanometer particle, which is a zero-dimensional material, and has great surface activity, it is easy to aggregate so as to lead to oxidization and quenching of fluorescence.

In Step 2, at least one of the sub-pixels is formed of an organic light-emitting material. If the red sub-pixel 231 is formed of an organic light-emitting material, then the red sub-pixel 231 can be made by mixing an organic host material with a red light emissive material and a solvent, coating and volatizing to remove the solvent; if the green sub-pixel 232 is formed of an organic light-emitting material, then the green sub-pixel 232 can be made by mixing an organic host material with a green light emissive material and a solvent, coating and volatizing to remove the solvent; and if the blue sub-pixel 233 is formed of an organic light-emitting material, then the blue sub-pixel 233 can be made by mixing an organic host material with a blue light emissive material and a solvent, coating and volatizing to remove the solvent.

The organic host material may comprise TCTA (4,4',4''-tri(carbazol-9-yl)-triphenylamine) or TRZ (2,4,6-tri(9H-carbazol-9-yl)-1,3,5-triazine) and the solvent may comprise methanol, ethanol, water, chlorobenzene, or chloroform.

The blue light emissive material may comprise 9,10-di(beta-naphthyl)anthracene (ADN), which has a structural formula as follows:

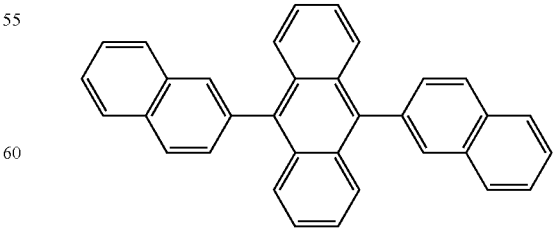

The green light emissive material may comprise tris(2-phenylpyridine)iridium (Ir(ppy)$_3$), which has a structural formula as follows:

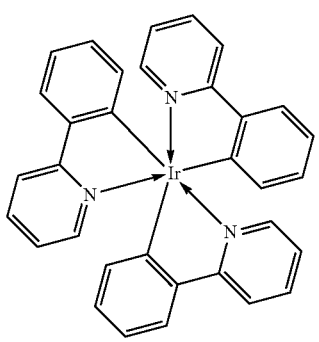

The red light emissive material may comprise 4-(dicyanomethylene)-2-methyl-6-(4-di methylaminostyryl)-4H-pyran (DCM), which has a structural formula as follows:

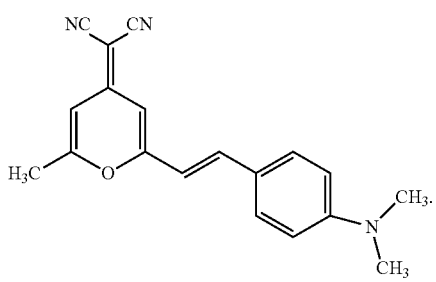

Preferably, in Step 2, the at least one of the sub-pixels being formed of an organic light-emitting material is that the red sub-pixel 231 and the green sub-pixel 232 are formed of organic light-emitting materials.

The substrate 1 can be a thin-film transistor (TFT) substrate. The substrate 1 and the package cover plate 2 are formed of glass or a flexible material. At least one of the substrate 1 and the package cover plate 2 is light-transmittable. Preferably, the substrate 1 and the package cover plate 2 are both made of glass sheets. The substrate 1 and the package cover plate 2 are bonded together by means of the sealing enclosing resin 3 to prevent invasion of external moisture and oxygen so as to seal and protect internal electronic components.

The anode 21, the hole transporting layer 22, the electron transporting layer 24, and the cathode 25 are each formed through a vacuum thermal evaporation process so that no fine metal mask (FMM) is needed. Preferably, the electron transporting layer 24 is formed of tris-(8-hydroxyquinolinato)aluminum (Alq3) and the hole transporting layer 22 is formed of poly(triphenylamine) (poly-TPD) or poly(ethylenedioxythiophene) (PEDOT).

Figure 2:
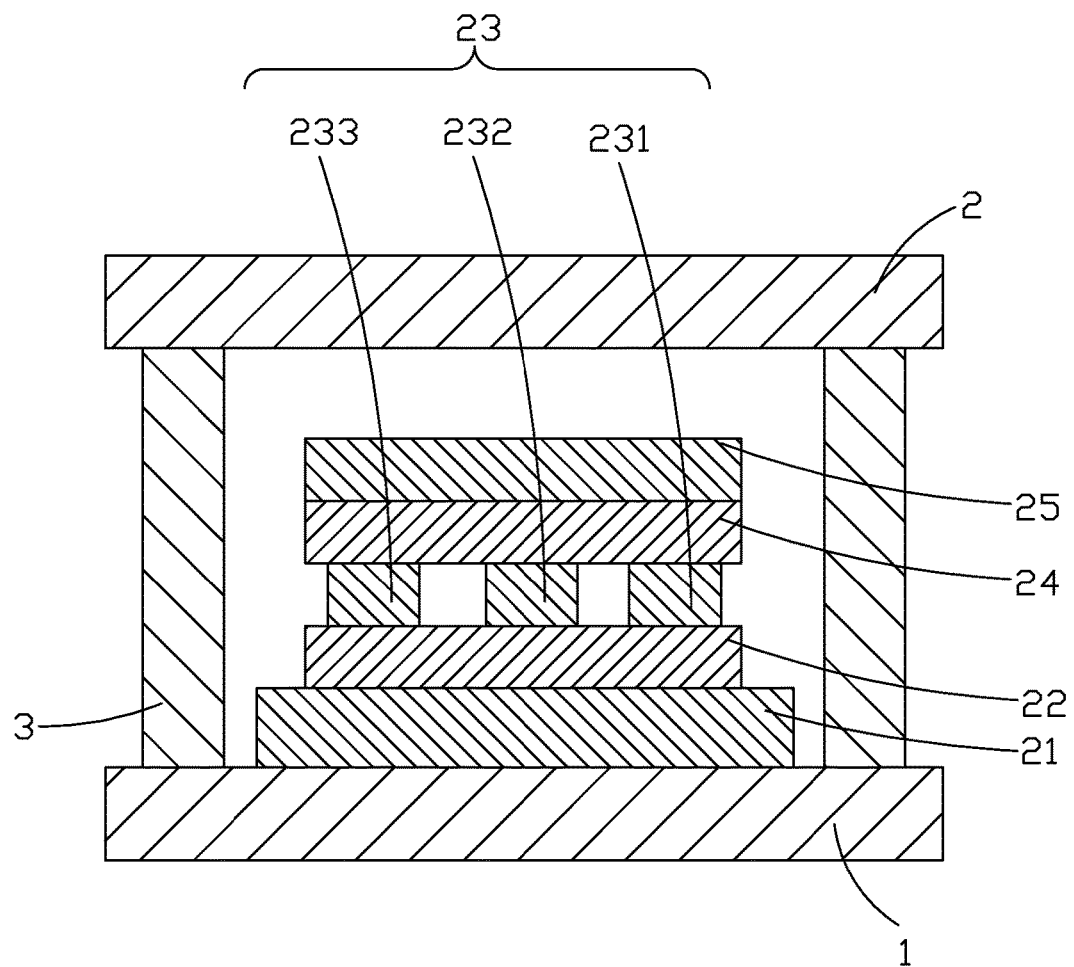
FIG. 2 is a schematic view illustrating a structure of the OLED device according to the present invention.

Referring to FIG. 2, based on the manufacturing method described above, the present invention further provides an OLED device, which comprises a substrate 1, an anode 21 formed on the substrate 1, a hole transporting layer 22 formed on the anode 21, an emissive layer 23 formed on the hole transporting layer 22, an electron transporting layer 24 formed on the emissive layer 23, a cathode 25 formed on the electron transporting layer 24, a package cover plate 2 arranged above the cathode 25, and sealing enclosing resin 3 arranged between the substrate 1 and the package cover plate 2 to bond the substrate 1 and the package cover plate 2 together.

The emissive layer 23 comprises a red sub-pixel 231, a green sub-pixel 232, and a blue sub-pixel 233, wherein each of the sub-pixels is formed through a solution film casting process and at least one of the sub-pixels is made of a quantum dot and at least one of the sub-pixels is made of an organic light-emitting material.

Preferably, the blue sub-pixel 233 is made of a quantum dot and the red sub-pixel 231 and the green sub-pixel 232 are made of organic light-emitting materials.

For at least one of the sub-pixels being formed of a quantum dot, if the red sub-pixel 231 is formed of a quantum dot, then the red sub-pixel 231 can be made by mixing an organic host material with a red quantum dot and a solvent, coating and volatizing to remove the solvent; if the green sub-pixel 232 is formed of a quantum dot, then the green sub-pixel 232 can be made by mixing an organic host material with a green quantum dot and a solvent, coating and volatizing to remove the solvent; and if the blue sub-pixel 233 is formed of a quantum dot, then the blue sub-pixel 233 can be made by mixing an organic host material with a blue quantum dot and a solvent, coating and volatizing to remove the solvent.

The organic host material comprises TCTA (4,4',4''-tri(carbazol-9-yl)-triphenylamine) or TRZ (2,4,6-tri(9H-carbazol-9-yl)-1,3,5-triazine).

The compound TCTA (4,4',4''-tri(carbazol-9-yl)-triphenylamine) has a structural formula as follows:

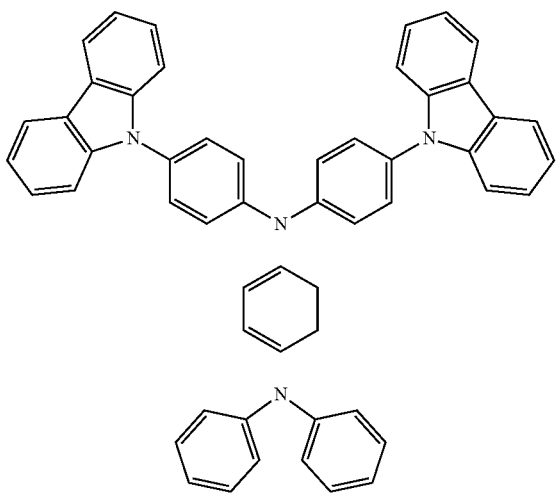

The compound TRZ (2,4,6-tri(9H-carbazol-9-yl)-1,3,5-triazine) has a structural formula as follows:

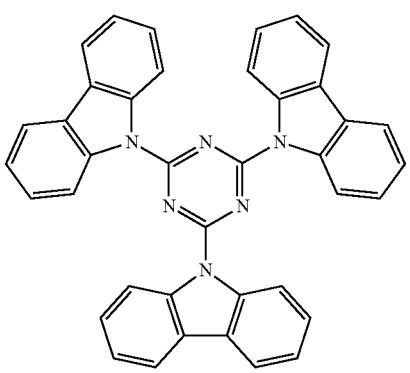

The solvent may comprise methanol, ethanol, chlorobenzene, or chloroform.

For at least one of the sub-pixels being formed of a quantum dot, if the red sub-pixel 231 is formed of a quantum dot, then the red sub-pixel 231 can be made by mixing a red quantum dot with a surface coating agent and a solvent, coating and volatizing to remove the solvent; if the green sub-pixel 232 is formed of a quantum dot, then the green sub-pixel 232 can be made by mixing a green quantum dot with a surface coating agent and a solvent, coating and volatizing to remove the solvent; and if the blue sub-pixel 233 is formed of a quantum dot, then the blue sub-pixel 233 can be made by mixing a blue quantum dot with a surface coating agent and a solvent, coating and volatizing to remove the solvent.

The blue quantum dot may comprises ZnCdS, CdSe/ZnS or nanometer $SiN_4$. The green quantum dot may comprise CdSe/ZnS or $ZnSe:Cu^{2+}$. The red quantum dot may comprise CdSe/CdS/ZnS.

The surface coating agent may comprise a stearic acid, trioctylphosphine oxide, or poly(methyl methacrylate).

The solvent may comprise methanol, ethanol, water, chlorobenzene, or chloroform.

In the above-described process of using a quantum dot to form a sub-pixel, the organic host material and the surface coating agent provide a common effect that is to prevent aggregation and oxidization of the quantum dot. Since a quantum dot is a nanometer particle, which is a zero-dimensional material, and has great surface activity, it is easy to aggregate so as to lead to oxidization and quenching of fluorescence.

For at least one of the sub-pixels being formed of an organic light-emitting material, if the red sub-pixel 231 is formed of an organic light-emitting material, then the red sub-pixel 231 can be made by mixing an organic host material with a red light emissive material and a solvent, coating and volatizing to remove the solvent; if the green sub-pixel 232 is formed of an organic light-emitting material, then the green sub-pixel 232 can be made by mixing an organic host material with a green light emissive material and a solvent, coating and volatizing to remove the solvent; and if the blue sub-pixel 233 is formed of an organic light-emitting material, then the blue sub-pixel 233 can be made by mixing an organic host material with a blue light emissive material and a solvent, coating and volatizing to remove the solvent.

The organic host material may comprise TCTA (4,4',4"-tri(carbazol-9-yl)-triphenylamine) or TRZ (2,4,6-tri(9H-carbazol-9-yl)-1,3,5-triazine) and the solvent may comprise methanol, ethanol, water, chlorobenzene, or chloroform.

The blue light emissive material may comprise 9,10-di(beta-naphthyl)anthracene (ADN), which has a structural formula as follows:

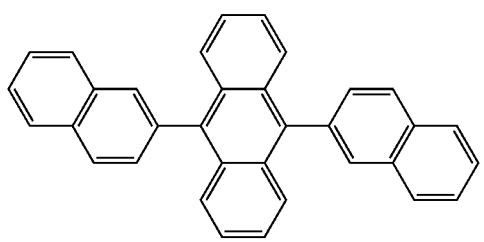

The green light emissive material may comprise tris(2-phenylpyridine)iridium ($Ir(ppy)_3$), which has a structural formula as follows:

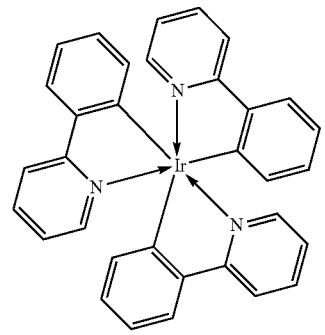

The red light emissive material may comprise 4-(dicyanomethylene)-2-methyl-6-(4-di methylaminostyryl)-4H-pyran (DCM), which has a structural formula as follows:

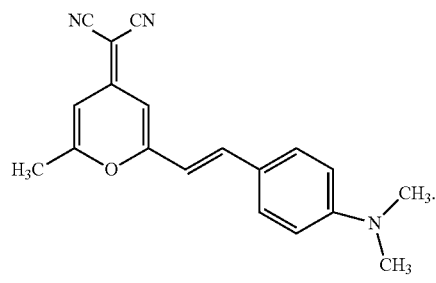

In the OLED device of the present invention, the substrate 1 can be a thin-film transistor (TFT) substrate. The substrate 1 and the package cover plate 2 are formed of glass or a flexible material. At least one of the substrate 1 and the package cover plate 2 is light-transmittable. Preferably, the substrate 1 and the package cover plate 2 are both made of glass sheets. The substrate 1 and the package cover plate 2 are bonded together by means of the sealing enclosing resin 3 to prevent invasion of external moisture and oxygen so as to seal and protect internal electronic components.

The anode 21, the hole transporting layer 22, the electron transporting layer 24, and the cathode 25 are each formed through a vacuum thermal evaporation process so that no fine metal mask (FMM) is needed. Preferably, the electron transporting layer 24 is formed of tris-(8-hydroxyquinolinato)aluminum (Alq3) and the hole transporting layer 22 is formed of poly(triphenylamine) (poly-TPD) or poly(ethylenedioxythiophene) (PEDOT).

Figure 3:
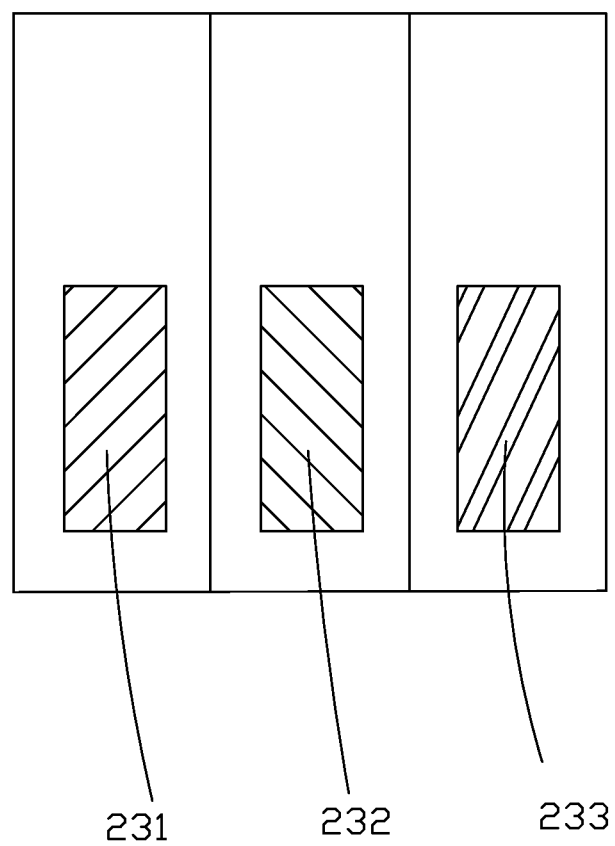
FIG. 3 is a schematic plan view illustrating an arrangement of pixels of the OLED device according to the present invention.
Figure 4:
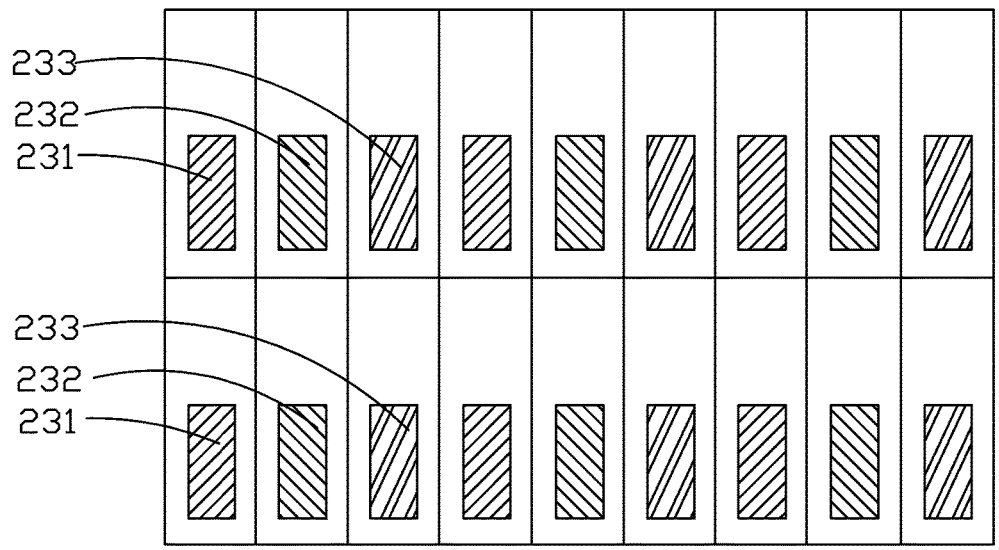
FIG. 4 is a schematic view illustrating an application of the arrangement of pixels shown in FIG. 3 in a display panel.
Figure 5:
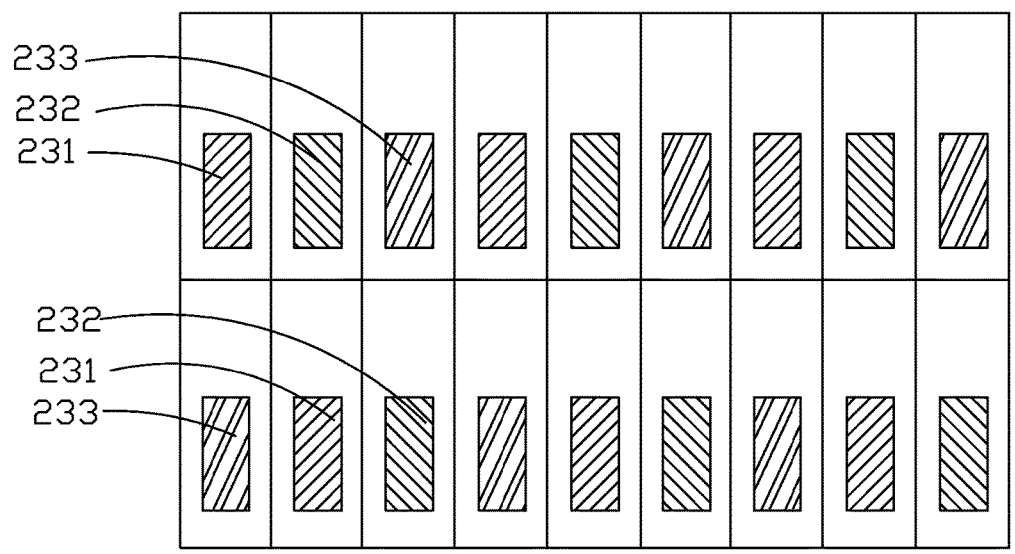
FIG. 5 is another schematic view illustrating an application of the arrangement of pixels shown in FIG. 3 in a display panel.
Figure 6:
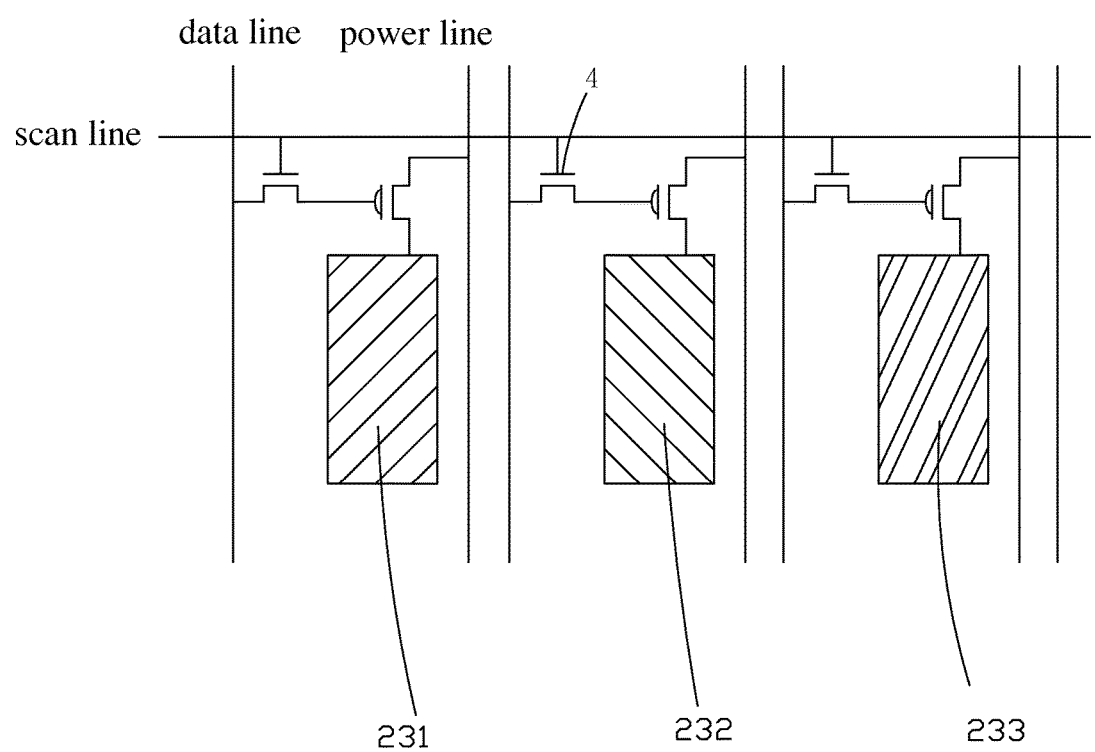
FIG. 6 is a schematic view illustrating a thin-film transistor (TFT) drive circuit of the arrangement of pixels shown in FIG. 3.

Referring to FIG. 3, which is a schematic plan view illustrating an arrangement of pixels of the OLED device according to the present invention. FIG. 4 is a schematic view illustrating an application of the arrangement of pixels shown in FIG. 3 in a display panel. FIG. 5 is another schematic view illustrating an application of the arrangement of pixels shown in FIG. 3 in a display panel. As shown in FIG. 6, the red sub-pixel 231, the green sub-pixel 232, and the blue sub-pixel 233 are each driven by a TFT (Thin-Film Transistor) 4. Each of the sub-pixels corresponds to one TFT in order to in order to control the emission of light from an area of the emissive layer that corresponds to the sub-pixel.

In summary, the present invention provides a method for manufacturing an OLED device, wherein each of sub-pixels of an emissive layer is formed through a solution film casting process and an anode, a hole transporting layer, an electron transporting layer, and a cathode are formed through vacuum thermal evaporation processes, so that the method for manufacturing the OLED device requires no use of a fine metal mask thereby making the manufacturing cost incurring with the manufacturing method low, the utilization rate of material high, and the yield rate good; and with at least one sub-pixel of the emissive layer being formed of a quantum dot and at least one sub-pixel being formed of an organic light-emitting material, the manufacturing method according to the present invention, when compared with a manufacturing method where all sub-pixels are formed of quantum dots, has a relatively low manufacturing cost and, when compared with a manufacturing method where all sub-pixels are formed of organic light-emitting materials, provides an OLED device having a better performance. An OLED device manufactured with the present invention combines the advantages of a QD-OLED and a solution-film-cast OLED so as to possesses excellent performance, allowing for application to flat panel displays, televisions, and other fields of displaying.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing an organic light-emitting diode (OLED) device, comprising:
   (1) providing a substrate and forming, in sequence, an anode and a hole transporting layer on the substrate;
   (2) forming an emissive layer on the hole transporting layer through a solution film casting process, wherein the emissive layer comprises a red sub-pixel, a green sub-pixel, and a blue sub-pixel, of which at least one sub-pixel is formed of a quantum dot and at least one sub-pixel is formed of an organic light-emitting material;
   (3) forming, in sequence, an electron transporting layer and a cathode on the emissive layer; and
   (4) providing a package cover plate, which is set above the cathode, wherein the substrate and the package cover plate are bonded together by sealing enclosing resin to complete packaging of the OLED device;
   wherein the anode, the hole transporting layer, the electron transporting layer, and the cathode are each formed through a vacuum thermal evaporation process and the electron transporting layer is formed of tris-(8-hydroxyquinolinato)aluminum and the hole transporting layer is formed of poly(triphenylamine) or poly(ethylenedioxythiophene).

2. The method for manufacturing the OLED device as claimed in claim 1, wherein the substrate comprises a thin-film transistor (TFT) substrate; the substrate and the package cover plate are formed of glass or a flexible material; and at least one of the substrate and the package cover plate is light transmittable.

3. The method for manufacturing the OLED device as claimed in claim 1, wherein in step (2), at least one of the sub-pixels is formed of a quantum dot and if the red sub-pixel is formed of a quantum dot, then the red sub-pixel is made by mixing an organic host material with a red quantum dot and a solvent, coating and volatizing to remove the solvent; if the green sub-pixel is formed of a quantum dot, then the green sub-pixel is made by mixing an organic host material with a green quantum dot and a solvent, coating and volatizing to remove the solvent; and if the blue sub-pixel is formed of a quantum dot, then the blue sub-pixel is made by mixing an organic host material with a blue quantum dot and a solvent, coating and volatizing to remove the solvent; the blue quantum dot comprises ZnCdS, CdSe/ZnS or nanometer $SiN_4$, the green quantum dot comprising CdSe/ZnS or ZnSe:$Cu^{2+}$, the red quantum dot comprising CdSe/CdS/ZnS; the organic host material comprises 4,4',4"-tri(carbazol-9-yl)-triphenylamine or 2,4,6-tri(9H-carbazol-9-yl)-1,3,5-triazine; and the solvent comprises methanol, ethanol, chlorobenzene, or chloroform.

4. The method for manufacturing the OLED device as claimed in claim 1, wherein in step (2), at least one of the sub-pixels is formed of a quantum dot and if the red sub-pixel is formed of a quantum dot, then the red sub-pixel is made by mixing a red quantum dot with a surface coating agent and a solvent, coating and volatizing to remove the solvent; if the green sub-pixel is formed of a quantum dot, then the green sub-pixel is made by mixing a green quantum dot with a surface coating agent and a solvent, coating and volatizing to remove the solvent; and if the blue sub-pixel is formed of a quantum dot, then the blue sub-pixel is made by mixing a blue quantum dot with a surface coating agent and a solvent, coating and volatizing to remove the solvent; the surface coating agent comprises stearic acid, trioctylphosphine oxide, or poly(methyl methacrylate); the solvent comprises methanol, ethanol, water, chlorobenzene, or chloroform; and the blue quantum dot comprises ZnCdS, CdSe/ZnS or nanometer $SiN_4$, the green quantum dot comprising CdSe/ZnS or ZnSe:$Cu^{2+}$, the red quantum dot comprising CdSe/CdS/ZnS.

5. The method for manufacturing the OLED device as claimed in claim 1, wherein in step (2), the at least one of the sub-pixels being formed of a quantum dot is that the blue sub-pixel is formed of a quantum dot.

6. The method for manufacturing the OLED device as claimed in claim 1, wherein in step (2), at least one of the sub-pixels is formed of an organic light-emitting material and if the red sub-pixel is formed of an organic light-emitting material, then the red sub-pixel is made by mixing an organic host material with a red light emissive material and a solvent, coating and volatizing to remove the solvent; if the green sub-pixel is formed of an organic light-emitting material, then the green sub-pixel is made by mixing an organic host material with a green light emissive material and a solvent, coating and volatizing to remove the solvent; and if the blue sub-pixel is formed of an organic light-emitting material, then the blue sub-pixel is made by mixing an organic host material with a blue light emissive material and a solvent, coating and volatizing to remove the solvent; the blue light emissive layer comprises 9,10-di(beta-naphthyl)anthracene, the green light emissive layer comprising tris(2-phenylpyridine)iridium, the red light emissive layer comprising 4-(dicyanomethylene)-2-methyl-6-(4-dimethylaminostyryl)-4H-pyran; the organic host material comprises 4,4',4"-tri(carbazol-9-yl)-triphenylamine or 2,4,6-tri(9H-carbazol-9-yl)-1,3,5-triazine; and the solvent comprises methanol, ethanol, chlorobenzene, or chloroform.

7. The method for manufacturing the OLED device as claimed in claim 1, wherein in step (2), the at least one of the sub-pixels being formed of an organic light-emitting material is that the red sub-pixel and the green sub-pixel are formed of organic light-emitting materials.

8. An OLED device manufactured with the method claimed in claim 1, comprising a substrate, an anode formed on the substrate, a hole transporting layer formed on the anode, an emissive layer formed on the hole transporting layer, an electron transporting layer formed on the emissive layer, a cathode formed on the electron transporting layer, a package cover plate arranged above the cathode, and sealing enclosing resin arranged between the substrate and the package cover plate to bond the substrate and the package cover plate together, the emissive layer comprising a red sub-pixel, a green sub-pixel, and a blue sub-pixel, wherein each of the sub-pixels is formed through a solution film casting process and wherein at least one of the sub-pixels is made of a quantum dot and at least one of the sub-pixels is made of an organic light-emitting material.

9. The OLED device as claimed in claim 8, wherein the blue sub-pixel is formed of a quantum dot and the red sub-pixel and the green sub-pixel are formed of organic light-emitting materials.

10. An OLED device manufactured with the method claimed in claim 1, comprising a substrate, an anode formed on the substrate, a hole transporting layer formed on the anode, an emissive layer formed on the hole transporting layer, an electron transporting layer formed on the emissive layer, a cathode formed on the electron transporting layer, a package cover plate arranged above the cathode, and sealing enclosing resin arranged between the substrate and the package cover plate to bond the substrate and the package cover plate together, the emissive layer comprising a red sub-pixel, a green sub-pixel, and a blue sub-pixel, wherein each of the sub-pixels is formed through a solution film casting process and wherein at least one of the sub-pixels is made of a quantum dot and at least one of the sub-pixels is made of an organic light-emitting material;

wherein the blue sub-pixel is formed of a quantum dot and the red sub-pixel and the green sub-pixel are formed of organic light-emitting materials.

* * * * *